(12) United States Patent
Gough et al.

(10) Patent No.: US 6,659,292 B2
(45) Date of Patent: Dec. 9, 2003

(54) RACK MOUNTABLE SYSTEMS

(75) Inventors: Gerald Ronald Gough, Houghton Regis (GB); Sean Conor Wrycraft, Harrow (GB)

(73) Assignee: Sun Microsystems, Inc., Santa Clara, CA (US)

(*) Notice: Subject to any disclaimer, the term of this patent is extended or adjusted under 35 U.S.C. 154(b) by 16 days.

(21) Appl. No.: 10/050,389

(22) Filed: Jan. 16, 2002

(65) Prior Publication Data

US 2002/0093795 A1 Jul. 18, 2002

(30) Foreign Application Priority Data

Jan. 17, 2001 (GB) .............................. 0101211

(51) Int. Cl.[7] .................................................. A47F 7/00
(52) U.S. Cl. ........................ 211/26; 312/222.2; 361/683
(58) Field of Search ................ 211/26, 175; 312/265.4, 312/222.2, 334.4, 334.8; 361/724, 683

(56) References Cited

U.S. PATENT DOCUMENTS

| | | | |
|---|---|---|---|
| 4,509,810 A | | 4/1985 | Erlam et al. |
| 4,979,909 A | * | 12/1990 | Andrews .................. 211/26 X |
| 5,332,306 A | | 7/1994 | Babb et al. |
| 5,460,441 A | | 10/1995 | Hastings et al. |
| 5,571,256 A | * | 11/1996 | Good et al. ..................... 211/26 |
| 5,941,621 A | | 8/1999 | Boulay et al. |
| 6,011,701 A | | 1/2000 | Kopp et al. |
| 6,067,225 A | | 5/2000 | Reznikov et al. |
| 6,275,377 B1 | * | 8/2001 | Liu et al. ................. 361/683 X |
| 6,313,985 B1 | * | 11/2001 | Chen et al. |
| 6,317,329 B1 | | 11/2001 | Dowdy et al. |
| 6,388,875 B1 | * | 5/2002 | Chen ...................... 361/683 X |
| 6,421,236 B1 | * | 7/2002 | Montoya et al. ......... 361/683 X |
| 6,424,534 B1 | | 7/2002 | Mayer et al. |
| 6,442,020 B1 | * | 8/2002 | Liu et al. .................... 361/683 |
| 6,469,889 B1 | * | 10/2002 | Gan |

FOREIGN PATENT DOCUMENTS

| | | |
|---|---|---|
| DE | 3409022 | 9/1985 |
| DE | 85 34 120.7 | 4/1986 |
| EP | 1132025 | 2/2001 |
| FR | 1.333.572 | 7/1963 |
| GB | 2290457 | 1/1996 |
| JP | 2000-149539 | 5/2000 |

OTHER PUBLICATIONS

International search report application no. PCT/GB 02/00062, mailed Apr. 25, 2002.

* cited by examiner

Primary Examiner—Robert W. Gibson, Jr.
(74) Attorney, Agent, or Firm—Meyertons Hood Kivlin Kowert & Goetzel, P.C.; B. Noël Kivlin (57) ABSTRACT

A rack mountable system unit includes a housing having first and second sides. First and second elongate plastics slides are secured to respective sides of the system unit. Each plastic slide is dimensioned to slide within a rack mountable rail and is tapered at one end thereof to facilitate insertion into the rail. The tapered end of the slides facilitates insertion into the rails and the use of plastics facilitates sliding. The maximum height of the slide is dimensioned to slide within the rack mountable rail. To further facilitate the sliding of the system unit along the racking, the sides include narrower portions alternating with portions dimensioned to slide within the rack mountable rail. The slides each have a flange and a releasable fixing at a front end thereof for securing the system unit to rack mountable rails. An upper surface of the slide has an alignment mark indicating an alignment position for a corresponding mark on a cover forming the top of the rack mountable unit for facilitating alignment of the mounting the cover on the rack mountable unit. The rack mountable rails are extendable to adapt to different racking systems. Each rack mountable rail has upper and lower bearing surfaces for engaging with upper and lower surfaces of one of the slides. Also, each rail has a flange at a front end thereof configured to mate with the releasable fixing of the slide.

23 Claims, 7 Drawing Sheets

RACK MOUNTABLE SYSTEMS

BACKGROUND OF THE INVENTION

This invention relates to rack mountable systems and to components of such systems.

Electronic equipment for commercial purposes is often designed to be mounted in racks. The racks come in different sizes and configurations. As a result, systems designed for rack mounting are ideally provided with adjustable rack mountings, including, for example, rails and sliders for mounting in the rails.

One example of rack mountable equipment is a server computer, for example a Netra-t1 100 server manufactured by Sun Microsystems, Inc., details of which server can be found at http://www.sun.com/products-n-solutions/hw/networking/netrat/t1/. This existing rack mountable equipment has a housing that is provided with metal slides formed integrally with the computer system housing as a stepped portion of the end of the computer systems housing. In order to adapt the server computer to different racking systems, mounting kits are available for standard 19-, 23-, 24-in. and 600 mm racks (1 in=25.4 mm). The kit includes a pair of rails configured for the standard racking system concerned. The rails are made of metal. Metal has typically been used for such racking systems, because of the strength, low cost and the possibility of forming the slides integrally with the housing of the computer system units. However, the metal to metal contact between the slides and the rails is undesirable due to the metal on metal scraping noise as the units are inserted and the difficulty of sliding. As a result, it is usual to provide plastics edging strips of U-shaped cross section that fit over the edges of the rails that contact the metal slides of the computer system housing. This does avoid the scraping noises and improves the ease of sliding of the computer system. However, these plastics edging strips can become dislodged, potentially fouling within the racking systems and making the sliding of the computer systems housing more difficult. Accordingly, it would be desirable to provide improved apparatus and methods of mounting rack mountable equipment within equipment housings.

SUMMARY OF THE INVENTION

An aspect of the invention provides a slide configured to be secured to a wall of a rack mountable system unit. The slide is formed from plastic material and has an elongate configuration to slide within a rack mountable rail, the slide tapering at one end thereof to facilitate insertion into the rail.

Another aspect of the invention provides a rack mountable system unit that includes a housing having first and second sides and first and second elongate plastics slides. Each slide is secured to a respective side of the system unit, is dimensioned to slide within a rack mountable rail and is tapered at one end thereof to facilitate insertion into the rail.

The use of a rail formed from plastics material (e.g., moulded from ABS-based plastics material) to have integral plastics bearing surfaces means that the need for separate bearing surfaces is avoided. Moreover, it means that a tapered end of the slide can readily be provided, which tapered end facilitates insertion of the end of the slide into the corresponding rail. The plastics slide can slide smoothly and silently along the rail, reducing the chance of the system unit getting stuck as it is slid into the racking.

The maximum height of the slide is dimensioned to slide within the rack mountable rail. In the present example, where the rack mountable unit has a low profile, the rack mountable rail has a height about the same as that of the sides of the system unit. In other embodiments, for example, the rack mountable unit can be higher than the rack mountable rail.

To further facilitate the sliding of the system unit along the racking, the sides include narrower portions alternating with portions dimensioned to slide within the rack mountable rail. This reduces the contact surface and consequently the sliding resistance.

The rack mountable unit typically has a front, a back, a top and a bottom as well as the first and second sides, each of said first and second elongate slides having a length that extends substantially along a respective slide from the front to the back thereof. In this case, the slide advantageously tapers at a rear end thereof to enable insertion of the rear of the system unit into the racking first.

The slide can be provided with a flange and a releasable fixing at a front end thereof for securing the system unit to the rack mountable rail. The releasable fixing is preferably a screw with a knurled head for manual operation thereof.

An upper surface of the slide can be provided with an alignment mark indicating an alignment position for a corresponding mark on a cover forming the top of the rack mountable unit for facilitating alignment of the mounting the cover on the rack mountable unit.

In an example of the invention, each slide is screwed to a respective side of the system unit.

In an embodiment of the invention the system unit is a computer server.

A further aspect of the invention provides a kit of parts including the rack mountable unit and a pair of rack mountable rails.

In an embodiment of the invention, the rack mountable rails are extendable to adapt to different racking systems. Each rack mountable rail has upper and lower bearing surfaces for engaging with upper and lower surfaces of one of the slides. Also, each rail has a flange at a front end thereof configured to mate with the releasable fixing of the slide.

A further aspect of the invention provides a method of mounting a rack mountable system unit in a rack. The method comprises: providing each of first and second sides of the system unit with a respective elongate plastics slides, each slide being secured to a respective side of the system unit, being dimensioned to slide within a rack mountable rail and tapering at one end thereof to facilitate insertion into the rail; and inserting the tapered end of the slides into respective rails and sliding the system unit along the rails.

The method can also include releasably securing the slides to the rails following insertion of the slides in the rails.

The method can also include initially adjusting adjustable rails to fit an available racking system and securing the rails to the racking system prior to insertion of the slides in the rails.

Further aspects and advantages of the invention will become apparent from the following description of an particular embodiment.

BRIEF DESCRIPTION OF THE DRAWINGS

Embodiments of the present invention will be described hereinafter, by way of example only, with reference to the accompanying drawings in which like reference signs relate to like elements and in which.

DESCRIPTION OF PARTICULAR EMBODIMENTS

Exemplary embodiments of the present invention are described in the following with reference to the accompanying drawings.

Figure 1:
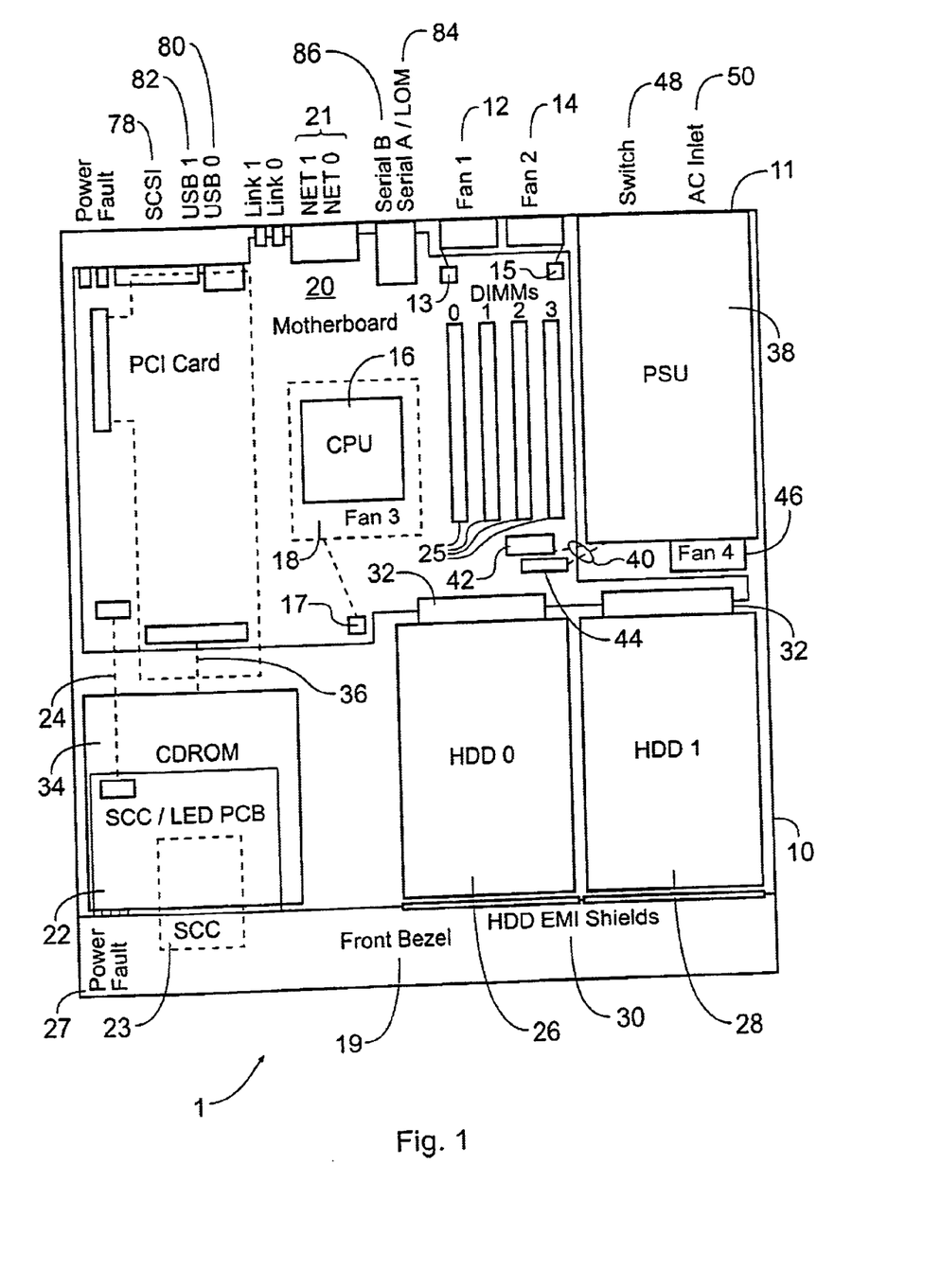
FIG. 1 is a physical plan view of a computer system that implements an embodiment of the invention.

FIG. 1 is a physical plan view of narrow form-factor computer system 1 designed for rack mounting. This computer system is compactly configured while offering high performance at reasonable cost.

The computer system 1 comprises a housing 10 with a front bezel 19 that is removable for front access to the disk drives and a System Configuration Card (SCC) 23 and reader 22. Rack mounting is supported for standard 19" racks via right-angled flanges (not shown). Slide-rail support is also provided.

The housing 10 is cooled, from front to rear, by two system fans 12, 14 mounted on a rear panel of the housing, with venting in the front and rear panels as required. The host processor (CPU) 16 also has its own dedicated local cooling comprising an impingement fan 18 that clips onto the CPU socket. These three fans plug directly into the motherboard 20 at 13, 15 and 17, respectively. The motherboard 20 is a PCB assembly, designed in a custom form-factor to fit the enclosure 10. The shape of the motherboard is chosen so as to minimise cabling within the enclosure. The motherboard 20 carries the majority of circuitry within the computer system 1.

All external interfaces are included directly on the rear edge of the motherboard, for access through the rear-panel 11 of the housing 10. The external interfaces comprise two network interfaces 21, two serial interfaces 84, 86 and a Small Computer System Interface (SCSI) interface 78. Indicators for Power, Fault and Network Link status are also positioned at the rear of the housing.

A system, or host, processor (CPU) 16 for the computer system 1 is mounted in a standard 370 pin zero insertion force (ZIF) socket on the motherboard 20. It has a passive heat sink. Dual in-line memory modules (DIMMs) are mounted in sockets 25 on the motherboard 20. A small printed circuit board (PCB) 22 is included at the front of the housing 10 to carry a System Configuration Card (SCC) 23 and LEDs 27 for Power and Fault status indication. A 10-way ribbon cable 24 connects this PCB to the motherboard 20. Two SCSI hard disk drives 26 and 28 are mountable in respective bays to the front of the motherboard 20. The drives are hot pluggable and are accessible by removal of the front bezel 19 and EMI shields 30. The two internal SCSI hard disk drives 26 and 28 plug directly into the motherboard via right-angled connectors 32 located on the front edge of the motherboard 20.

A slim (notebook-style) CDROM drive bay is provided, mounted laterally in front of the motherboard for a CDROM drive 34. Compact disks may be inserted and removed via an access slot (not shown) located on the lower left side of the front bezel 19. A connector at the rear of the CDROM bay connects the CDROM drive 34 via a ribbon cable 36 to the motherboard 20.

A Power Supply Unit (PSU) 38 is connected to the motherboard via a short harness 40 with two mating connectors 42 and 44 for power and services. The PSU 38 has its own cooling fan 46 and additionally houses the system power switch 48 and power input connector(s) 50.

Figure 2:
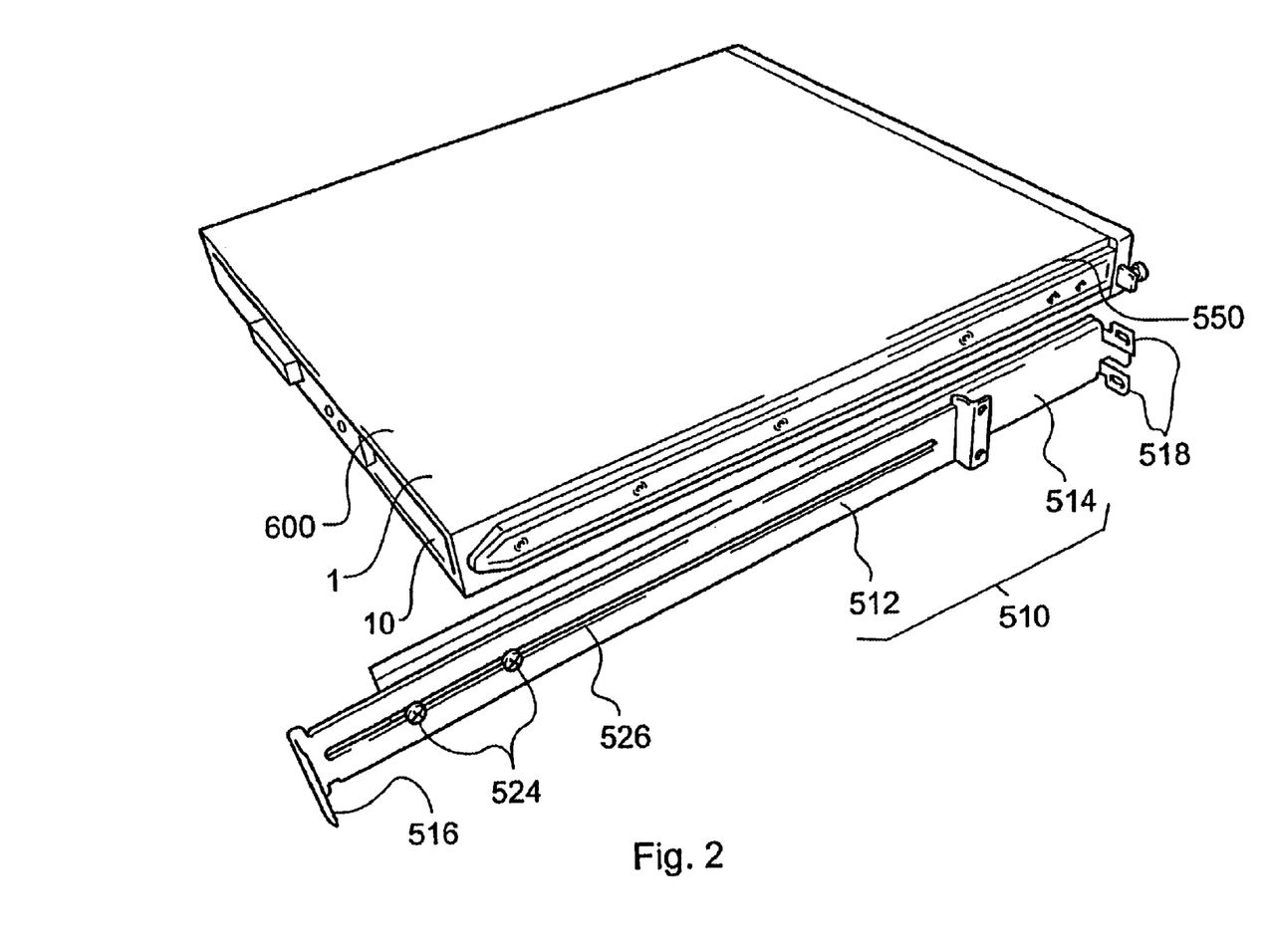
FIG. 2 is a perspective view of a thin format computer system housing with an example of a rack mounting system in accordance with an embodiment of the present invention.

FIG. 2 is a perspective view of a rack mountable system unit in the form of a computer server 1. The computer server 1 includes a housing 10 and a cover 600. Attached to each side of the housing 10 is an elongate slide 550 formed of plastics material. Any appropriate technique for forming the slide, e.g. a conventional moulding technique, can be used. Any suitable plastics, for example a PC+ABS plastics material such as GE CYCOLOY C6200 plastics can be used. Also shown in FIG. 2 is an adjustable metal rail 510 (e.g. of mild steel or another suitable metal) which comprises two portions 512 and 514 slideably mounted with respect to each other by means of screws 524 that slide within a slot 526. At either end of the rail are provided flanges 516 and 518 for mounting the adjustable rail in a racking system.

Figure 3:
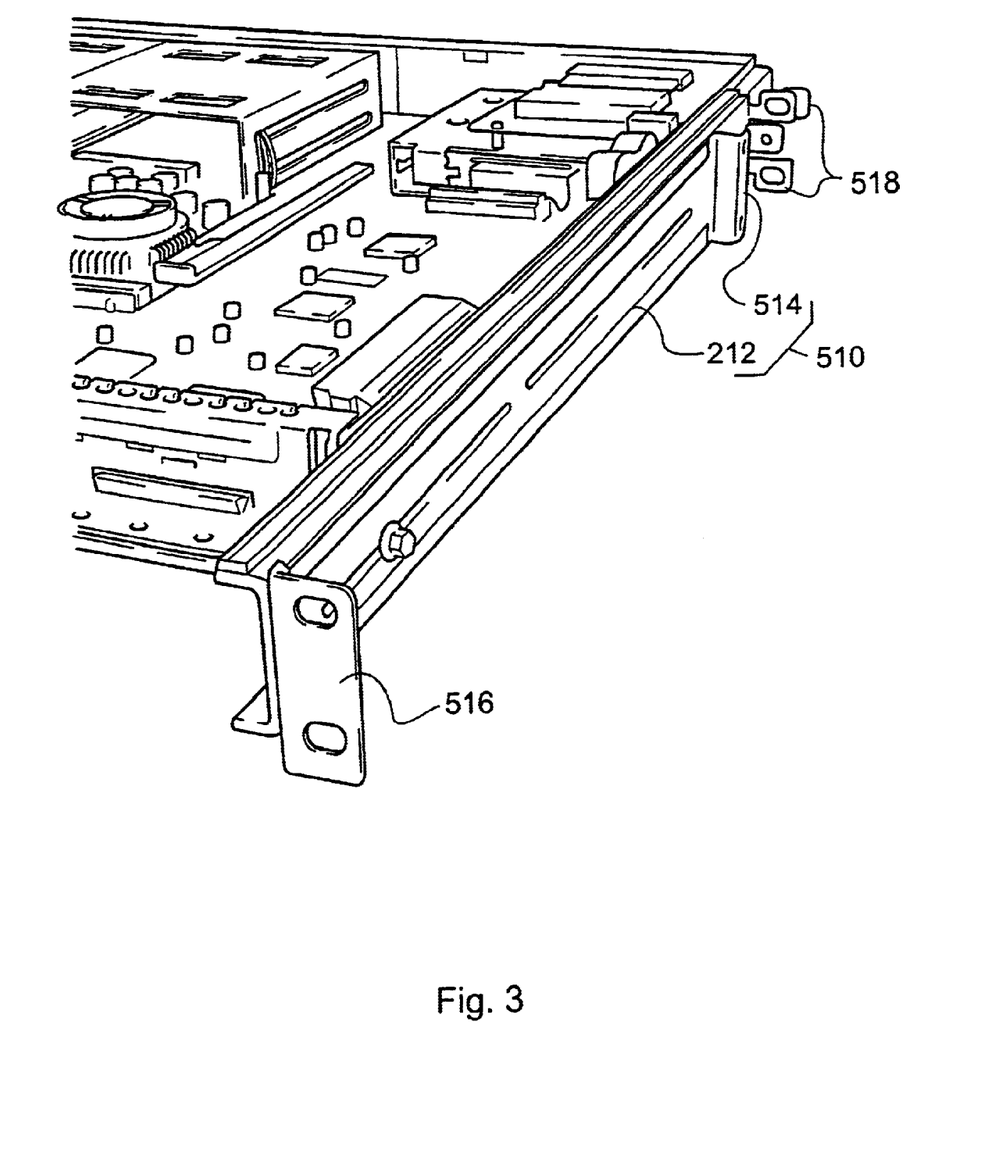
FIG. 3 is a perspective view illustrating further aspects of the rack mounting system of FIG. 2.

FIG. 3 is a further perspective view giving a slightly different angle on the rail structure 510, and also showing the cover 600 of the computer system 1 removed.

Figure 4:
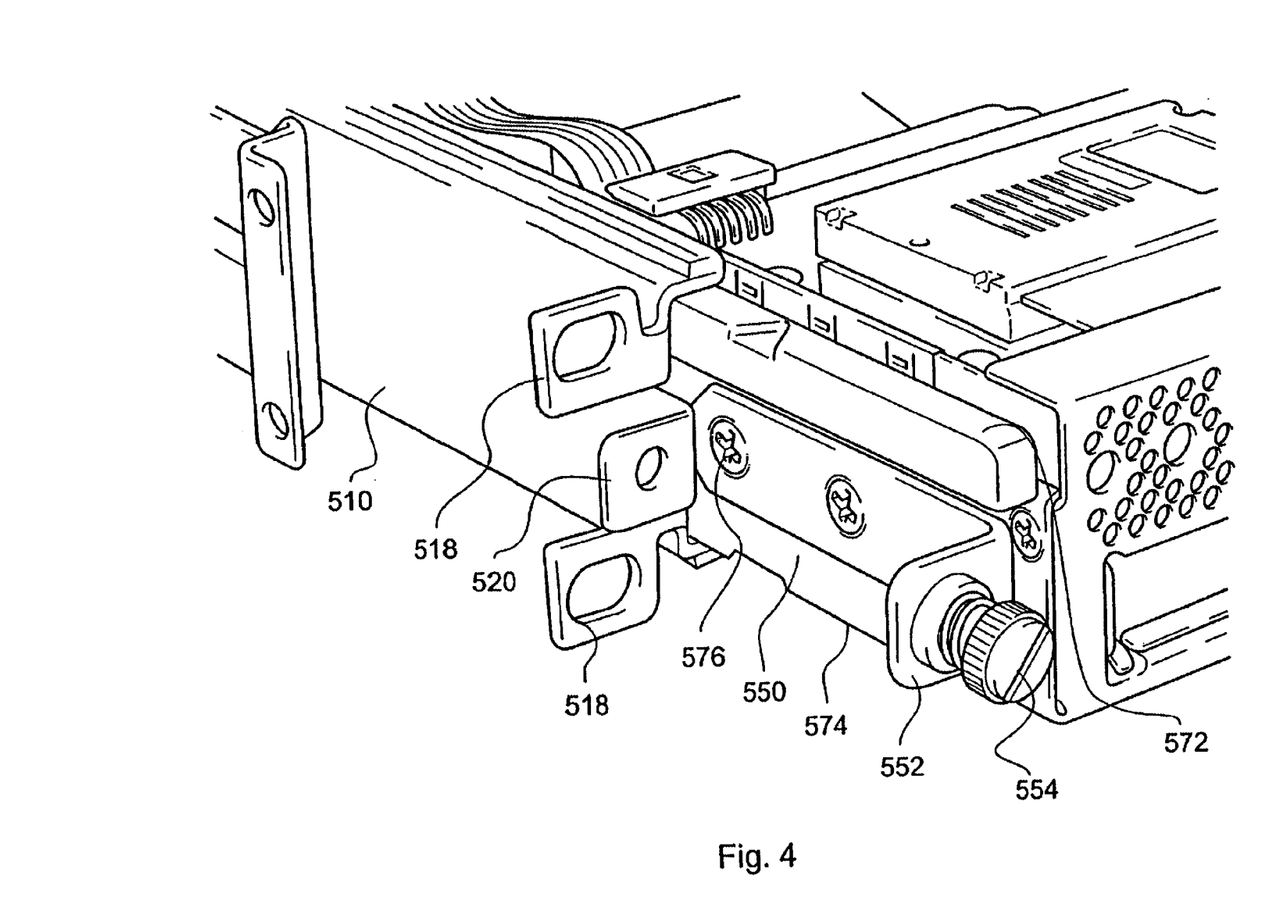
FIG. 4 illustrates the detail of the rack mounting system.

FIG. 4 illustrates a detail of the interaction between the adjustable rail 510 and the plastic slide 550. It can be seen that the metal rail 510 has a generally U-shape which extends around one side and the top and bottom edges 572 and 574, respectively, of the slide 550. As well as the flanges 518, already referred to, the rail 510 has a further flange 520 with a slotted hole for receiving a screw 554 with a knurled head. The screw 554 is fixably mounted on a metal flange 552 (e.g., formed from mild steel), which is attached to the slide 550 by screws 576. The screw 554 is used to secure the computer system 1 to the rail 510 when the rail has been installed in racking. The rail 510 is installed in the racking by adjusting the rail to the appropriate length and then applying screws through the holes in the flanges 518 and 516 to the front and back, respectively, of the racking (not shown).

Figure 5:
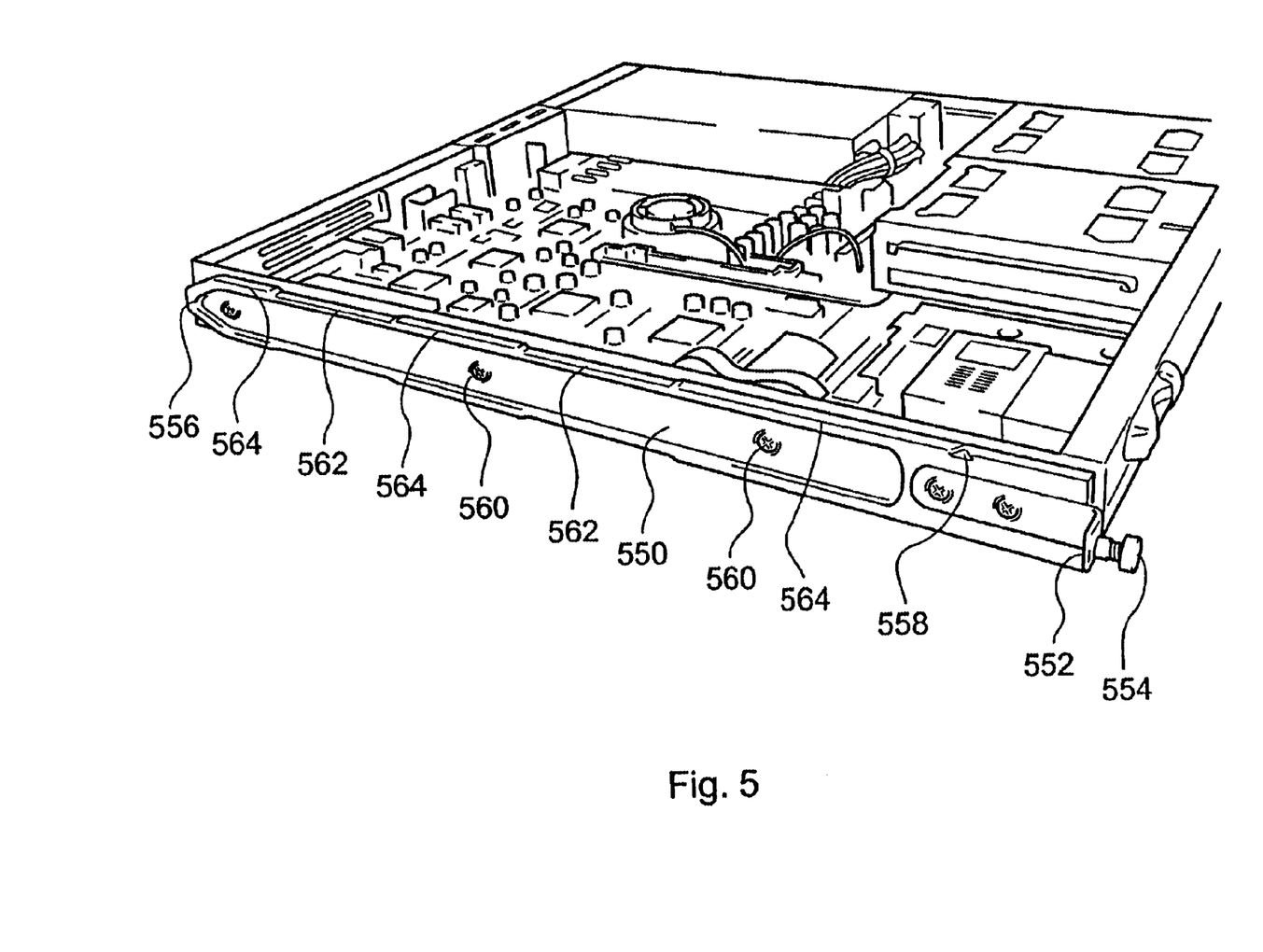
FIG. 5 illustrates a slide on a system unit of an embodiment of the invention.

FIG. 5 is a further side view of the computer system unit with the cover removed. This shows the slide 550 in more detail. It can be seen that the slide is elongate and has portions labelled 564 which are dimensioned to fit slideably within the rail 510. In other words, the vertical dimension (or height) of the slide (as seen in FIG. 5) is chosen to fit comfortably within the U-shaped rail 510, to permit the slide to be slid in and out of the rail 510. To reduce the sliding resistance, portions of the slide 550 are cut back to have a reduced height, as represented, for example, at 562. This reduces the amount of the slide in contact with the rail, and therefore reduces the sliding resistance.

In the present example, where the rack mountable unit has a low profile, the rack mountable rail has a height about the same as that of the sides of the system unit. In other embodiments, for example, the rack mountable unit can be higher than the rack mountable rail.

To facilitate the initial entry of the slide 550 into the U-shaped rail 510, the portion at the rear of the slide, i.e. at the rear of the system unit and at the end of the slice opposite to that of the knurled wheel 554, is tapered to form a nose 556. As the width of the nose 556 is substantially less than the width of the U-shaped rail, entry of the slide into the rail is greatly facilitated. The slide 550 is attached to the metal wall of the housing 10 of the computer system 1 by means of screws 560 that pass through respective holes, or apertures, in the slide 550 into threaded holes (not shown) in the housing wall.

Figure 6:
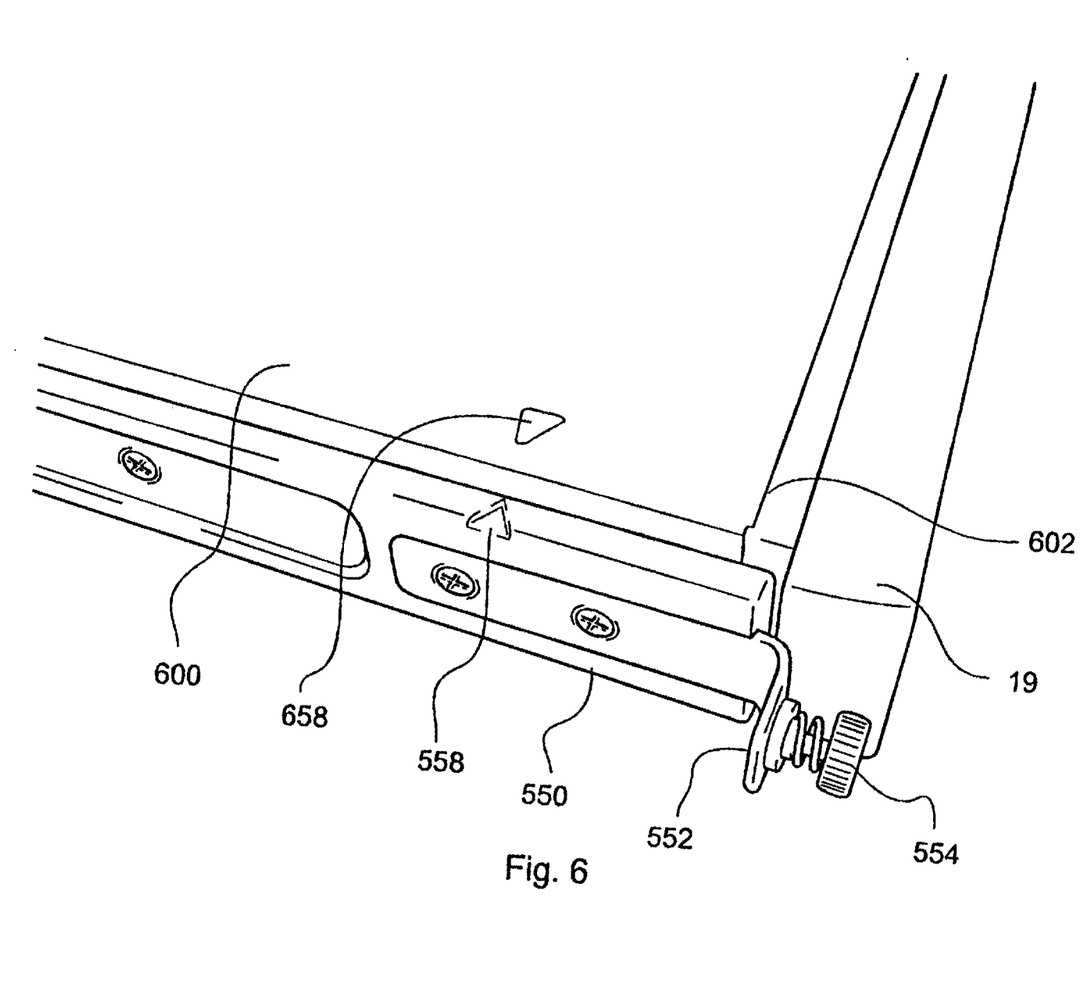
FIG. 6 illustrates how a mark provided on the slide of FIG. 5 is used for alignment with a mark on a cover of the housing.

FIG. 6 illustrates a mark 558 provided on the top of the slide 550, which mark is used to align with a corresponding mark 658 on the cover 600, to facilitate mounting of the cover on the housing 10 of the unit 1. As can be seen in FIG. 6, the cover is initially located on the housing with the marks 558 and 658 aligned, whereby the front edge of the cover 600 is spaced from the front bezel 19 of the computer system 1.

Figure 7:
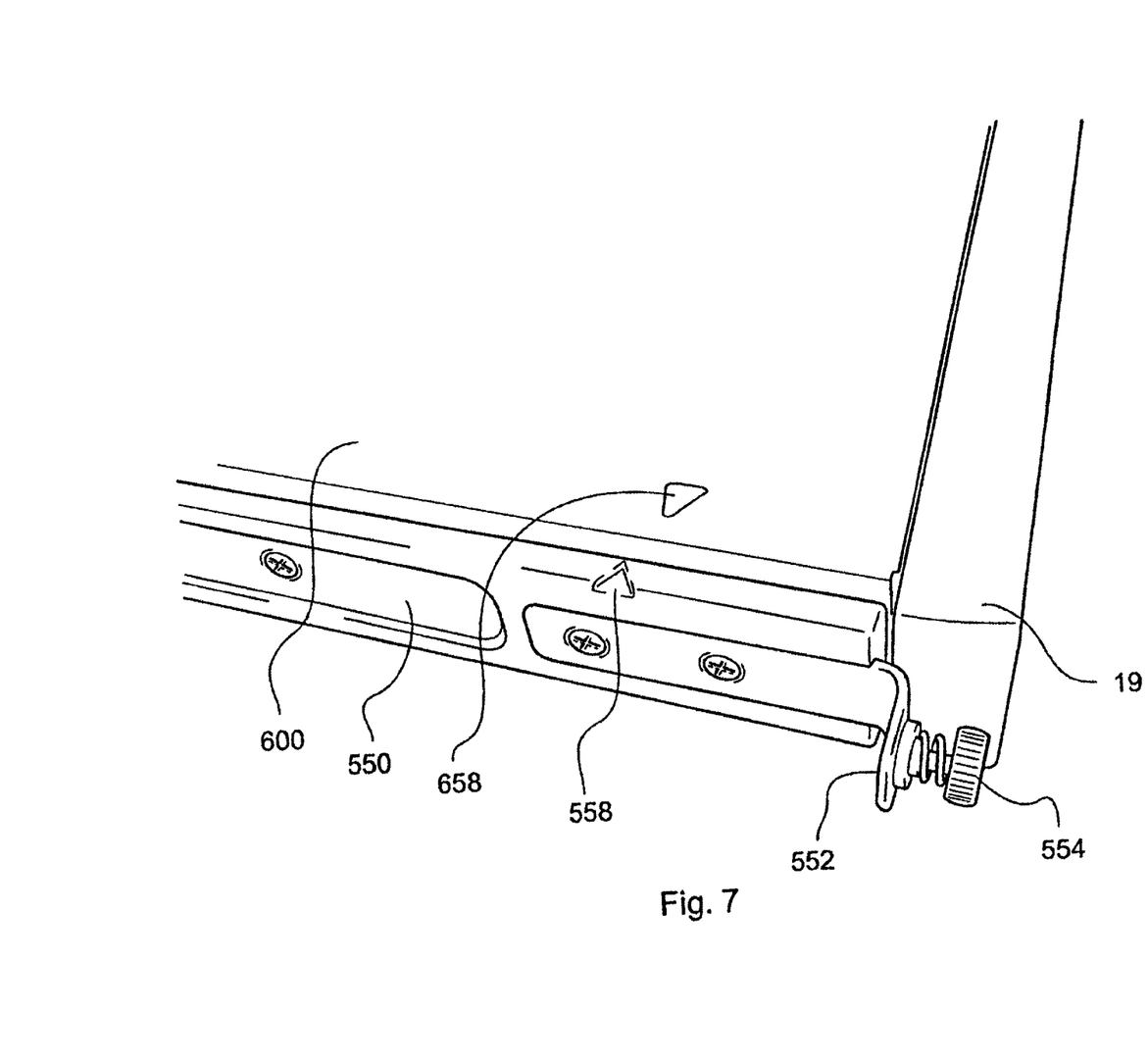
FIG. 7 illustrates the cover slid into its final position covering the housing.

FIG. 7 shows the final resting place of the cover, after it has then been slid forward from the position shown in FIG. 6. It can thus be seen that the mark 658 is now closer to the front bezel 19 than it was previously, and also that the front edge 502 of the cover 600 is now aligned with the front bezel. The cover can be secured in place by means of a screw (e.g., with a knurled head to avoid the need for tools) at the rear thereof.

The provision of a plastic slide for integrating with the adjustable rail provides a very flexible and adaptable system of mounting rack-mountable units, (for example a server computer) within a wide range of racking systems, with reliable and easy insertion and removal of the system unit being achieved.

Although a particular embodiment of the invention has been described, it will be appreciated that the invention is not limited thereto and that many modifications, including additions, deletions and substitutions may be made within the spirit and scope of the claimed invention.

For example, the slide in the present example is made of plastics material with a metal flange secured thereto with screws. However, in other embodiments the slide could be integrally formed with metal and plastics components (for example with the metal flange, or a metal core moulded into the plastics material of the slide) provided that the bearing surfaces for sliding in the rail are of plastics material and are integral to the slide.

What is claimed is:

1. A slide configured to be secured to a wall of a rack mountable system unit, the slide being formed from plastics material and having an elongate configuration to slide within a rack mountable rail, the slide having a tapered portion at one end for facilitating insertion into the rail, the tapered portion tapering out to a first width and the slide further comprising portions having a width substantially equal to the first width alternating with portions narrower than the first width for reducing sliding resistance within the rack mountable rail.

2. The slide of claim 1, including holes for receiving screws to secure the slide to a side of the system unit.

3. The slide of claim 1, comprising a flange and a releasable fixing, the flange and the releasable fixing being located at an end of the slide opposite to the end having the tapered portion for securing the system unit to the rack mountable rail.

4. The slide of claim 3, wherein the releasable fixing is a screw with a knurled head for facilitating manual operation of the screw.

5. The slide of claim 1, wherein a upper surface of the slide is provided with an alignment mark indicating an alignment position for a corresponding mark on a cover forming the top of the rack mountable unit to facilitate alignment during mounting of the cover on the rack mountable unit.

6. A rack mountable system unit comprising a housing having first and second sides and first and second elongate plastics slides, each slide being secured to a respective side of the system unit and being formed from plastics material and having an elongate configuration to slide within a rack mountable rail, each slide having a tapered portion at one end for facilitating insertion into the rail, the tapered portion tapering out to a first width and the slide further comprising portions having a width substantially equal to the first width alternating with portions narrower than the first width for reducing sliding resistance within the rack mountable rail.

7. The rack mountable system unit of claim 6, wherein each slide is screwed to a respective side of the system unit.

8. The rack mountable system unit of claim 6, the rack mountable unit having a front, a back, a top and a bottom as well as the first and second sides, each of said first and second elongate slides having a length that extends substantially along a respective slide from the front to the back thereof.

9. The rack mountable system unit of claim 6, wherein a maximum height of the slide is dimensioned to slide within the rack mountable rail, the rack mountable rail having a height about the same as that of the sides of the system unit.

10. The rack mountable system unit of claim 6, wherein the slide tapers at a rear end thereof.

11. The rack mountable system unit of claim 6, wherein the slide comprises a flange and a releasable fixing at a front end thereof for securing the system unit to the rack mountable rail.

12. The rack mountable system unit of claim 11, wherein the releasable fixing is a screw with a knurled head for facilitating manual operation of the screw.

13. The rack mountable system unit of claim 6, wherein a upper surface of the slide is provided with an alignment mark indicating an alignment position for a corresponding mark on a cover forming the top of the rack mountable unit to facilitate alignment during mounting of the cover on the rack mountable unit.

14. The rack mountable system unit of claim 6, wherein the system unit is a computer server.

15. A kit of parts comprising two slides and two rack mountable rails, each slide configured to be secured to a wall of a rack mountable system unit, being formed from plastics material and having an elongate configuration to slide within a respective rack mountable rail, each slide having a tapered portion at one end for facilitating insertion into the rail, the tapered portion tapering out to a first width and the slide further comprising portions having a width substantially eciual to the first width alternating with portions narrower than the first width for reducing sliding resistance within the rack mountable rail.

16. The kit of parts of claim 15, wherein the rack mountable rails are extendable to adapt to different racking systems.

17. The kit of parts of claim 15, wherein each rack mountable rail has upper and lower bearing surfaces for engaging with upper and lower surfaces of one of the slides.

18. The kit of parts of claim 15, wherein each rail has a flange at a front end thereof configured to mate with the releasable fixing of the slide.

19. A method of mounting a rack mountable system unit in a rack, the method comprising:

providing each of first and second sides of the system unit with a respective elongate slides formed of plastics material, each slide being secured to a respective side of the system unit, being dimensioned to slide within a rack mountable rail and having a tapered portion at one end for facilitating insertion into the rail, the tapered portion tapering out to a first width and each slide further comprising portions having a width substantially equal to the first width alternating with portions narrower than the first width for reducing sliding resistance within the rack mountable rail; and inserting the tapered portion of the slides into respective rails and sliding the system unit along the rails.

20. The method of claim 19, comprising releasably securing the slides to the rails following insertion of the slides in the rails.

21. The method of claim 18, further comprising initially adjusting adjustable rails to fit an available racking system and securing the rails to the racking system prior to insertion of the slides in the rails.

22. The method of claim 19, further comprising initially adjusting adjustable rails to fit an available racking system and securing the rails to the racking system prior to insertion of the slides in the rails.

23. A rack mountable system unit comprising housing means having first and second sides and first and second elongate plastics slide means, each slide means being secured to a respective side of the system unit, being dimensioned to slide within a rack mountable rail and having a tapered portion at one end for facilitating insertion into the rail, the tapered portion tapering out to a first width and each slide further comprising portions having a width substantially equal to the first width alternating with portions narrower than the first width for reducing sliding resistance within the rack mountable rail.

* * * * *

UNITED STATES PATENT AND TRADEMARK OFFICE
CERTIFICATE OF CORRECTION

PATENT NO. : 6,659,292 B2 Page 1 of 1
DATED : December 9, 2003
INVENTOR(S) : Gough et al.

It is certified that error appears in the above-identified patent and that said Letters Patent is hereby corrected as shown below:

Column 6,
Line 50, please replace "eciual" with -- equal --.

Signed and Sealed this

Twenty-second Day of June, 2004

JON W. DUDAS
*Acting Director of the United States Patent and Trademark Office*